(12) United States Patent
Walters

(10) Patent No.: US 6,326,905 B1
(45) Date of Patent: Dec. 4, 2001

(54) CODED ROTARY SWITCH WITH CONTACTS AT COMMON RADIUS

(75) Inventor: Robert E. Walters, Webster, NY (US)

(73) Assignee: Detection Systems, Inc., Fairport, NY (US)

( * ) Notice: Subject to any disclaimer, the term of this patent is extended or adjusted under 35 U.S.C. 154(b) by 0 days.

(21) Appl. No.: 09/371,433

(22) Filed: Aug. 10, 1999

(51) Int. Cl.[7] ................................................ H03M 1/22
(52) U.S. Cl. ............................................... 341/16; 341/1
(58) Field of Search ................................... 341/1, 16

(56) References Cited

U.S. PATENT DOCUMENTS

| | | | |
|---|---|---|---|
| 4,400,597 | * | 8/1983 | Bruder et al. ........................ 200/6 B |
| 4,728,755 | * | 3/1988 | Fowler et al. .................. 200/11 DA |
| 5,008,498 | * | 4/1991 | Yamazaki ........................... 200/11 R |
| 5,315,077 | * | 5/1994 | Simon et al. ...................... 200/11 R |

* cited by examiner

Primary Examiner—Peguy Jeanpierre

(57) ABSTRACT

A rotary switch includes a plurality of first electrical contacts disposed at a common radius and a plurality of second electrical contacts mounted for rotation against said first electrical contacts at said common radius. The first electrical contacts include at least one contact representing a selectable logic level and other first contacts electrically isolated from the at least one contact. The second electrical contacts electrically couple the logic level contact(s) with a unique combination of the isolated contacts in each of the respective switch positions.

20 Claims, 5 Drawing Sheets

CODED ROTARY SWITCH WITH CONTACTS AT COMMON RADIUS

DESCRIPTION

1. Field of Invention

The invention relates to rotary electrical switches and to such switches having contacts coded to represent numeric values. More comprehensive aspects of the invention relate to security systems including addressable event detectors employing such switches to facilitate communications with microprocessors in control panels.

2. Background of the Invention

Security systems often include many event detectors in wired or wireless loops coupled to a local control panel. The loops might include fire and intrusion detectors, for example, that communicate with the panel when a covered event is detected. The panel controls the detectors and reports detected events both locally, through visual and audible alarms, and to a remote monitoring service.

Communications between the detectors and the panel often employ a unique address assigned to each detector when it is installed. The panel can address each detector individually by its unique address, and the detector includes its address in communications with the panel. In the latter case, the panel uses the address to identify the location of the detected event.

Many different types of address-setting switches are used in security detectors, including selectively positioned shunts and DIP (Dual Inline Package) switches. Most pertinent to the present invention are rotary coded switches set to represent multi-bit binary numbers. One example is sold as an electrical component adapted for mounting on a printed circuit board. It has contacts aligned in a row at different radial positions and a rotary cam with lobes positioned to selectively engage the contacts. Each contact represents one bit of a multi-bit binary number. Another example has a first set of contacts etched on a printed circuit board and another set of contacts mounted for rotation in engagement with the first contact set. Again, discrimination between the respective contacts is accomplished by radial displacement.

Although existing switches operate to accomplish their intended purpose, they suffer, for example, from complexity, relatively high cost, less than desired reliability or unduly large size. One problem involves numerous parts that add to the complexity of the switch, increasing manufacturing cost and reducing reliability. This problem is exaggerated by the number of parts that move relative to other parts or other components of the detector circuit. Another problem results from the radial displacement of the switch contacts, which requires a radial switch dimension sufficient to accommodate the contact displacement. This radial displacement undesirably increases the size of the switch. Although some problems are reduced by integrating the switch with the circuit board, others remain.

SUMMARY OF THE INVENTION

The invention provides a rotary switch that is small and reliable, having only a few parts that are inexpensive and easy to manufacture and assemble. It has particular utility with security devices where it provides unique addresses to facilitate communications between the devices and a local control panel.

According to one aspect of the invention, a switch having X rotary positions includes a plurality of first electrical contacts disposed at a common radius and a plurality of second electrical contacts mounted for rotation against the first electrical contacts at the common radius. The first electrical contacts include at least one contact representing a selectable logic level and other first contacts electrically isolated from the logic level contact(s). The second electrical contacts electrically couple the logic level contact(s) with a unique combination of the isolated contacts in each of the respective X positions. According to more specific features of this aspect, the first electrical contacts are disposed on a printed circuit board and the second electrical contacts are formed from a single piece of conductive material, such as a metal stamping. The first contacts define Y bits and the second contacts electrically connect the first contacts in X different positions to represent X unique binary numbers.

According to other aspects of the invention, a rotary switch is provided having multiple positions representing multi-bit binary numbers. The switch has a plurality of first electrical contacts fixed in a ring including logic level contacts and switching contacts. A plurality of second electrical contacts are mounted for rotation as a unit against the first contacts to define the multiple positions. The second contacts electrically couple unique combinations of the switching contacts to the logic level contacts in the respective positions. According to more specific features of this aspect, the first electrical contacts are defined by a circuit board, the second electrical contacts are defined by resilient conductive material and the resilient conductive material is compressed toward the circuit board. Still more specifically, each respective one of the switching contacts is unopposed by any respective other of the switching contacts.

More comprehensive aspects of the invention include a security product having a rotary switch as defined above, especially for communicating with a microprocessor of a local control panel. The first contacts include contacts electrically coupled to a microprocessor for selecting logic levels, and other contacts read by the microprocessor to establish addresses for communicating with the control panel.

These and other features and advantages of the invention will be more clearly understood and appreciated from a review of the following detailed description of the preferred embodiments and appended claims, and by reference to the accompanying drawings.

DETAILED DESCRIPTION OF THE INVENTION

Figure 1:
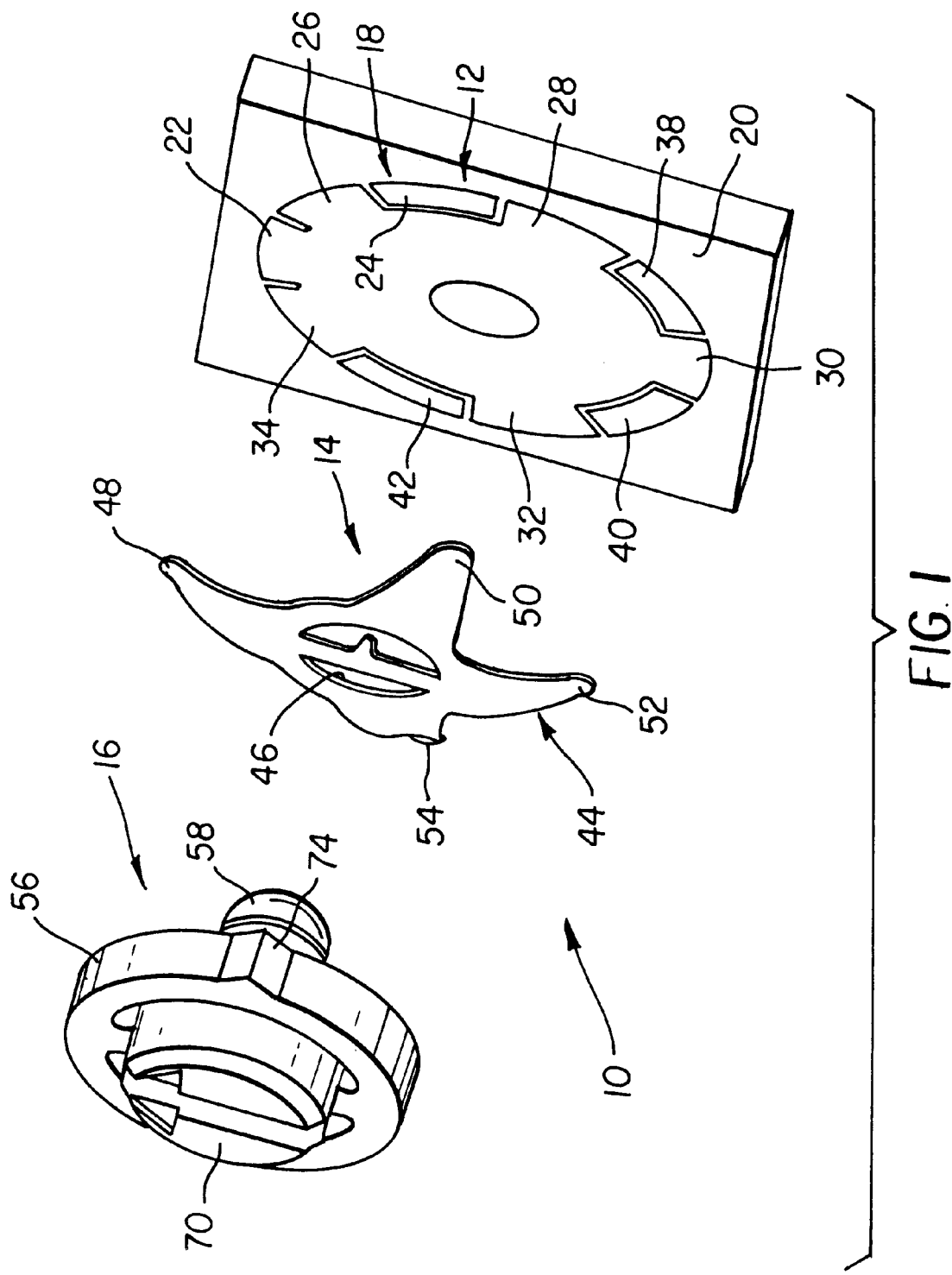
FIG. 1 is an exploded view of a rotary switch in accordance with a preferred embodiment of the invention.
Figure 2:
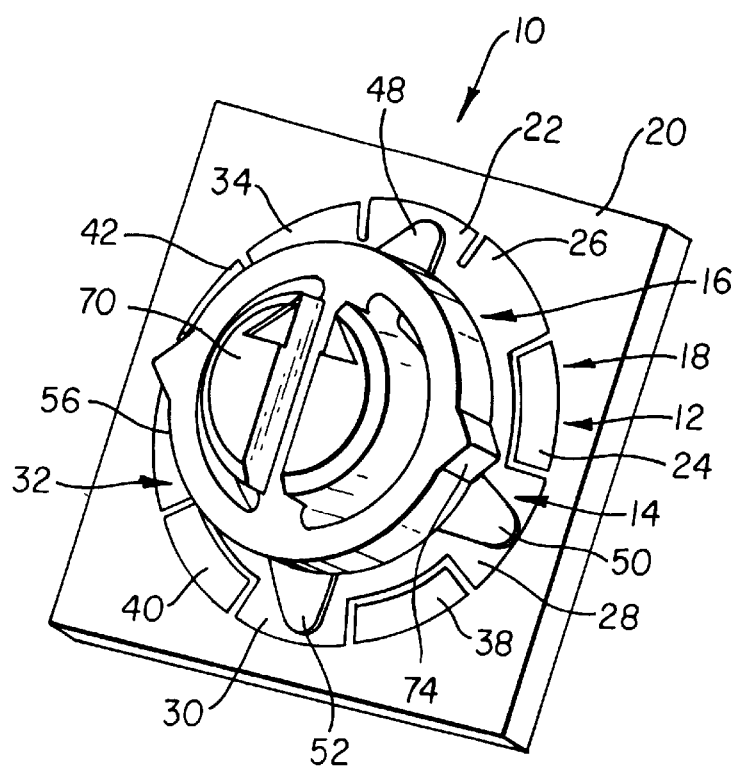
FIG. 2 is a perspective view of the switch of FIG. 1 with the parts assembled.

Referring now to a preferred embodiment of the invention, beginning with FIGS. 1–8, a coded rotary switch is disclosed including first electrical contacts 12, second electrical contacts 14 and dial 16.

First electrical contacts 12 preferably comprise a fixed pattern of conductive pads 18 that are etched on a printed circuit board (PCB) 20. The contacts 12 define a first set of contacts or pads disposed in a ring on the circuit board at a common radius. The circuit board 20 provides a flat, stiff surface supporting the first contacts 12 in a common plane. The board 20 also provides relatively rigid structure for mounting other switch components.

The first electrical contacts 12 include at least one contact 22 representing a selected logic level, such as zero or one, and other first contacts 24, sometimes referred to as switching contacts. The rotary switch of the preferred embodiment is a ten position switch for producing four bit or four place binary numbers. It has ten first contacts including: 1) a group of six logic level contacts 22, 26, 28, 30, 32, and 34, at positions 0, 1, 3, 7 and 9, respectively; and, 2) a group of four switching contacts 24, 38, 40 and 42, at positions 2, 4, 6 and 8, respectively. The six logic level contacts are electrically coupled to each other with no significant resistance between them, so they are all at the same logic level. The four switching contacts are electrically isolated from each other and from the logic level contacts, except when closed by the rotary switch 10, as will be described hereinafter.

In the preferred embodiment, the switching contacts 24 are disposed so no respective switching contact is opposed on a common diameter by another switching contact. Logic level contacts 22 are positioned both to oppose each respective switching contact 24 and to separate adjacent switching contacts 24.

Second contacts 14 preferably are formed in a spider shape from a single piece of conductive material, such as a resilient metal stamping 44. The stamping includes a hub 46 with radial arms 48, 50, 52 and 54 extending outward from the hub 46. The arms are mechanically connected to rotate as a unit, and are bent all in the same direction out of the plane of hub 46. Since there is essentially no electrical resistance between the arms, they act as electrical bridges for closing or shorting electrical connections between the switching contacts 24 and the logic level contacts 22.

Three arms 50, 52 and 54 of the second electrical contacts 14 have a first angular spacing, while the remaining arm 48 has a different angular spacing. The respective angles are chosen in the preferred embodiment so the second contacts can be positioned to engage ten unique combinations of the switching contacts including no switching contacts. In the preferred embodiment, the angles between arms 50, 52 and 54 are seventy two degrees, while the angles between arms 54, 48 and 50 are one hundred eight degrees.

Dial 16 preferably is an injected molded part having an outer rim 56 and a shaft or post 58 extending axially from the rim 56. When the switch is assembled, the post 58 extends through the hub 46 of the second contacts 14 to capture and compress the second contacts 14 for rotation against the first contacts 12. The post is bifurcated at 60 (FIG. 8) to capture the second contacts 14 and rotate the second contacts 14 as a unit with the dial 16.

The switch 10 has particular utility in a security system for identifying individual system devices, such as event detectors. One switch might be used in combination with other similar switches, for example, to set a unique binary code or address that facilitates communications between each respective detector and a local control panel.

Figure 10:
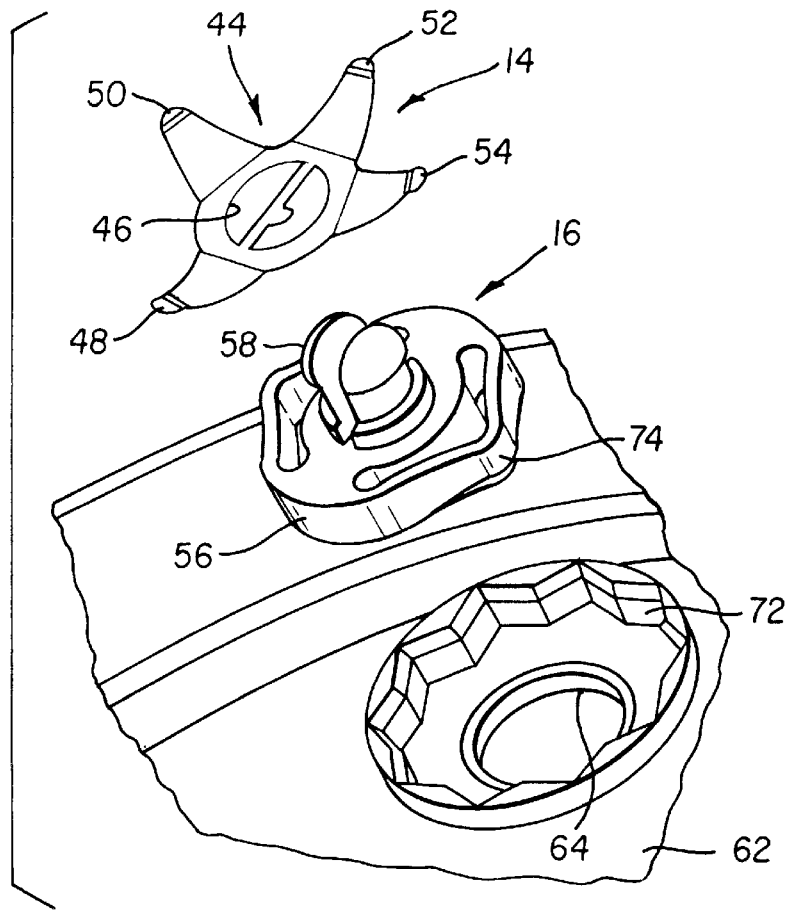
FIG. 10 is a partial perspective view of selected parts of the FIG. 1 switch depicting how it is mounted in an event detector such as a smoke alarm.
Figure 11:
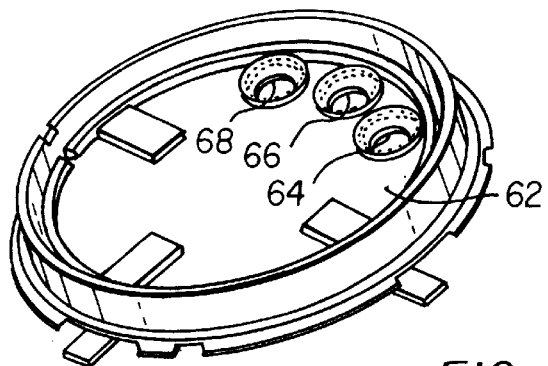
FIG. 11 is a perspective view of an event detector depicting recesses for receiving three of the rotary switches depicted in FIG. 1.

When one or more of the switches 10 are used with a security device, the switches can be integrated with the other components of the device, providing a very compact design that is easy to manufacture with automated equipment. The printed circuit board 20 that supports the switch would be the same board that supports other components of the security device. Similarly, the housing of the security device would cooperate with dial 16 to define detents or points of resistance at each of the ten switch positions. Referring to FIGS. 10 and 11, a portion of a smoke detector housing 62 is depicted with apertures 64, 66 and 68 designed to receive dial 16. A top part 70 (FIGS. 1 and 2) of the dial 16 extends through the apertures and is accessible outside the housing for setting the switch to the desired rotary position. When the smoke detector cover is in position, interior surfaces 72 of the cover interact with a resilient portion 74 molded into the rim 56 of the switch 10. This interaction defines the ten rotary positions of the switch.

Figure 3:
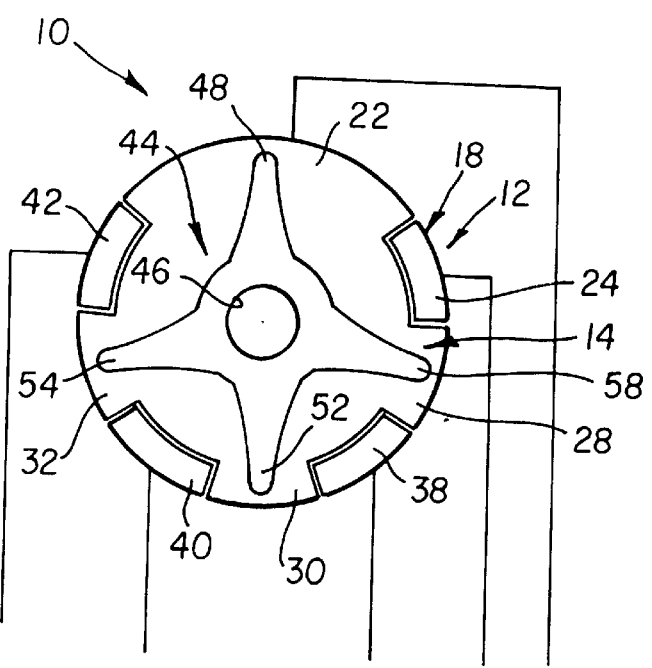
FIG. 3 is a simplified schematic of the switch of FIG. 1 representing its electrical connections.
Figures 4, 5:
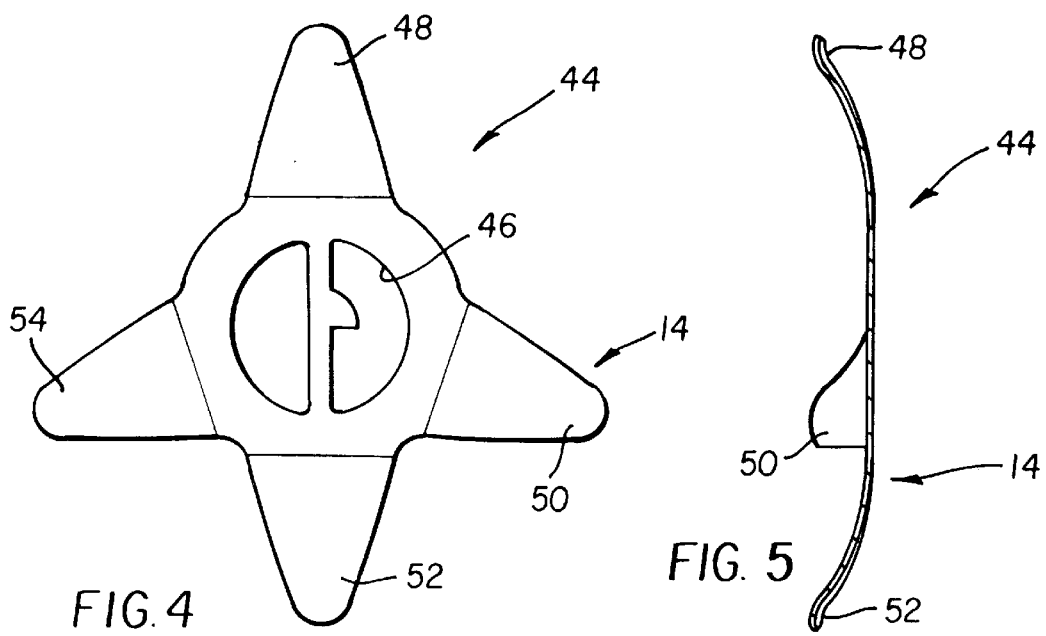
FIGS. 4 and 5 are top and side views, respectively, of a set of second contacts forming part of the switch of FIG. 1.
Figures 6, 7:
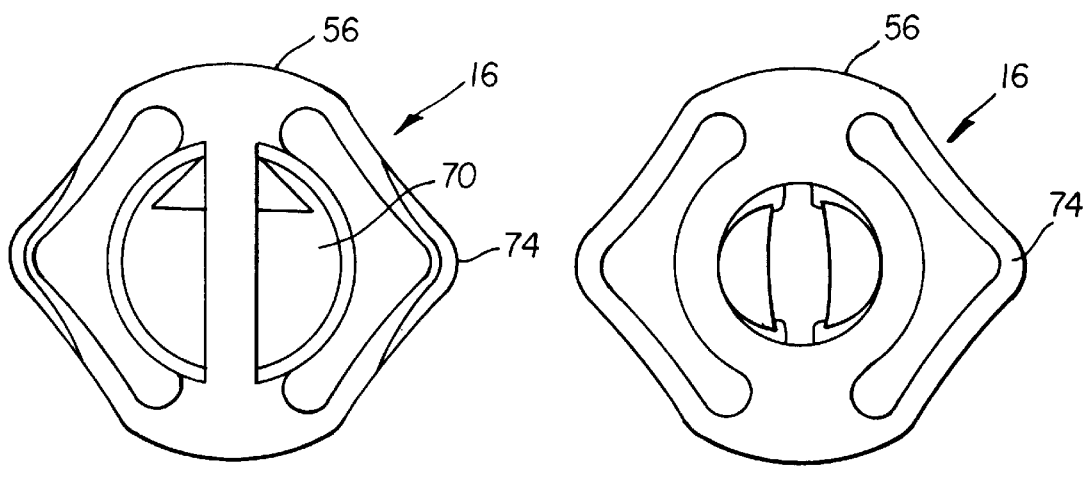
FIGS. 6, 7, and 8 are top, bottom and side views, respectively, of a dial and shaft forming part of the switch of FIG. 1.
Figure 8:
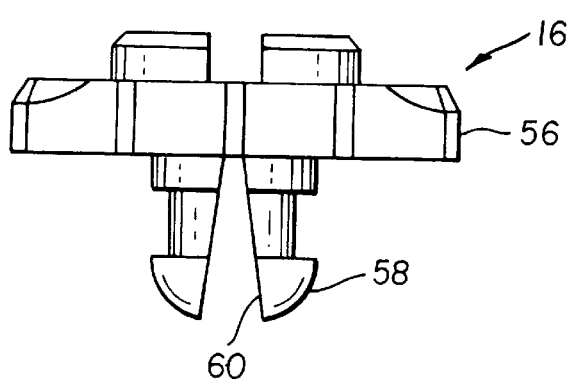
Figure 9:
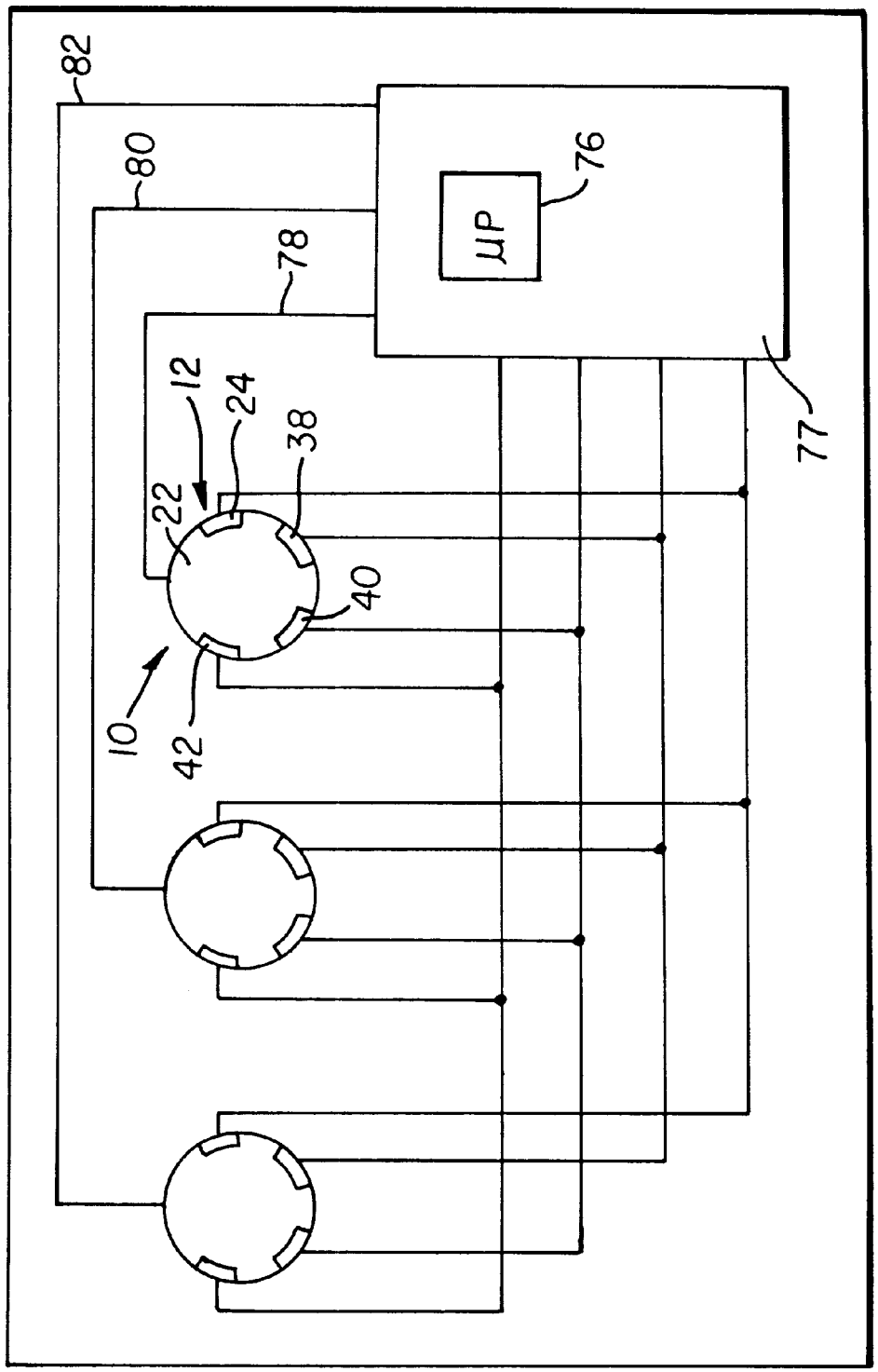
FIG. 9 is a simplified schematic of three FIG. 1 switches coupled electronically to a microprocessor.

Referring now to FIGS. 3 and 9, the switch is adapted for electrical connection to a microprocessor 76 in a control panel 77. The microprocessor 76 sets the logic level for each respective switch through electrical leads 78, 80 and 82. The microprocessor then reads or detects a four bit binary number from each respective switch as determined by the rotary position of the switch. The rotary position of the switch, in turn, determines which switching contacts 24 are connected through the second contacts 14 to the logic level contacts 26. In FIG. 3, for example, switching contact 24 represents the first digit, switching contact 26 the second digit, switching contact 28 the third digit and switching contact 30 the forth digit. The second contacts 14 are in the zero position and are not engaging any switching contact 24. In this position, the binary number represented by the switch position is zero. As the switch is rotated through its ten positions in a clockwise direction, other binary numbers are represented as depicted in the following table. "C" stands for engagement between a second contact 14 and the identified switching contact 24. "NC" stands for no engagement.

TRUTH TABLE

| | Bit or Contact | | | | |
|---|---|---|---|---|---|
| Position | 1 | 2 | 3 | 4 | Decimal |
| 0 | NC | NC | NC | NC | 0 |
| 1 | NC | C | C | C | 14 |
| 2 | C | NC | NC | NC | 1 |
| 3 | NC | NC | C | C | 12 |
| 4 | NC | C | NC | NC | 2 |
| 5 | C | NC | NC | C | 9 |
| 6 | NC | NC | C | NC | 4 |
| 7 | C | C | NC | NC | 3 |
| 8 | NC | NC | NC | C | 8 |
| 9 | C | C | C | NC | 7 |

The microprocessor translates the ten unique numbers represented by the ten switch positions into a sequence of ten numbers more easily understood by the system operator. Zero might be ten, fourteen might be one, one might be two, twelve might be three, two might be four, nine might be five, four might be six, three might be seven, eight be eight and seven might be nine. Although not necessary for the proper operation of the switch, such translation makes it easier for an installer to set the switch on installation.

Other devices could be substituted for the microprocessor to perform similar functions, including ASIC's custom and discrete logic gates and similar devices that will be apparent to those skilled in the art.

A switch according to the invention can be manufactured relatively inexpensively in a compact design. It requires few parts, some of which can be incorporated into a printed circuit board of the host device. Changes in the position of the switch rotates one contact against another, using friction to remove oxidation and improve contact. Although the preferred embodiment is a ten position switch for producing four bit binary numbers, hexadecimal codes with greater or fewer significant places certainly are within the scope of the invention.

While the invention is described in connection with a preferred embodiment, other modifications and applications will occur to those skilled in the art. The claims should be interpreted to fairly cover all such modifications and applications within the true spirit and scope of the invention.

PARTS LIST

| Reference No. | Part |
| --- | --- |
| 10. | Coded rotary switch. |
| 12. | First electrical contacts. |
| 14. | Second electrical contacts. |
| 16. | Dial. |
| 18. | Conductive pads. |
| 20. | Printed circuit board. |
| 22. | Logic level contact. |
| 24. | Switching contacts. |
| 26. | Logic level contact. |
| 28. | Logic level contact. |
| 30. | Logic level contact. |
| 32. | Logic level contact. |
| 34. | Logic level contact. |
| 38. | Switching contacts. |
| 40. | Switching contacts. |
| 42. | Switching contacts. |
| 44. | Metal stamping. |
| 46. | Hub. |
| 48. | Radial arm. |
| 50. | Radial arm. |
| 52. | Radial arm. |
| 54. | Radial arm. |
| 56. | Outer rim. |
| 58. | Shaft or post. |
| 60. | Bifurcation. |
| 62. | Smoke detector housing. |
| 64. | Aperture |
| 66. | Aperture |
| 68. | Aperture |
| 70. | Top part. |
| 72. | Interior surface. |
| 74. | Resilient portion. |
| 76. | Microprocessor. |
| 78. | Electrical lead. |
| 80. | Electrical lead. |
| 82. | Electrical lead. |

What is claimed is:

1. A binary coded rotary switch having X switching positions, comprising:
   a plurality of first electrical contacts electrically isolated from each other and disposed at a common radius;
   a plurality of second electrical contacts mounted for relative movement into electrical contact with said first electrical contacts at said common radius, said second electrical contacts having minimal electrical resistance therebetween;
   wherein said second electrical contacts electrically couple said first electrical contacts in unique combinations in each one of said respective X positions.

2. A binary coded rotary switch according to claim 1, wherein said first electrical contacts are disposed on a printed circuit board.

3. A binary coded rotary switch according to claim 1, wherein said second electrical contacts are a continuous conductive material.

4. A binary coded rotary switch according to claim 1, wherein said second electrical contacts are defined by metallic arms extending radially from a common metallic hub.

5. A binary coded rotary switch according to claim 1, wherein said first contacts are defined by fixed patterns on a circuit board, said second contacts are defined by metallic arms fixed to a common hub and said first contacts and said second contacts are coupled for relative rotation by a shaft extending through said hub to said circuit board.

6. A binary coded rotary switch according to claim 1, wherein said first contacts define Y bits and said second contacts electrically connect said first contacts in X different positions to represent X unique binary numbers.

7. A binary coded rotary switch according to claim 6 where X is 10 and Y is 4.

8. A rotary switch having multiple positions representing multi-bit binary numbers, said switch comprising:
   a plurality of first electrical contacts fixed in a ring at a common radius, said first electrical contacts including logic level contacts and switching contacts;
   a plurality of second electrical contacts mounted for rotation as a unit against said first contacts to define said positions, said second contacts electrically coupling unique combinations of said switching contacts to said logic level contacts in said respective positions.

9. A rotary switch according to claim 8, wherein said respective switching contacts each represent a different one of said multi-bits.

10. A rotary switch according to claim 8, wherein:
    there is no significant resistance between said second electrical contacts;
    there is no significant resistance between said logic level contacts; and,
    said switching contacts are electrically isolated from each other except through said second contacts.

11. A rotary switch according to claim 8, wherein said first electrical contacts are defined by a circuit board, said second electrical contacts are defined by resilient conductive material and said resilient conductive material is compressed toward said circuit board.

12. A rotary switch according to claim 8, wherein said first electrical contacts are conductive pads on a printed circuit board, said second electrical contacts are a metallic stamping having a hub and resilient radial arms extending from said hub and said switch includes a shaft rotatably mounting said stamping with said arms in compression against said circuit board.

13. A rotary switch according to claim 8, wherein each respective one of said switching contacts is unopposed by any respective other of said switching contacts.

14. A rotary switch having X positions representing Y-bit binary numbers, said switch comprising:
    a plurality of first electrically isolated contacts fixed at a common radius, each of said respective isolated contacts representing a different one of said Y bits;
    a plurality of second electrical contacts mounted for rotation as a unit against said first contacts to define said X positions, said second contacts electrically coupling unique combinations of said isolated contacts to a predetermined logic level in said respective X positions to represent X unique binary numbers.

15. A rotary switch according to claim 14, wherein said first contacts are defined by fixed patterns on a circuit board, said second contacts are defined by a metallic member and said first contacts and said second contacts are coupled for relative rotation by a shaft extending through said hub to said circuit board.

16. A security product including a rotary switch settable to a selected one of a plurality of positions, said positions representing multi-bit binary addresses, said switch comprising:
- a plurality of first electrical contacts spaced in fixed positions at a common radius, said first electrical contacts including logic switchable contacts;
- a plurality of second electrical contacts mounted for rotation as a unit relative to said first contacts to selectively engage said first contacts, said second contacts electrically coupling unique combinations of said switchable contacts to a selected logic level in said respective positions, thereby to establish said addresses.

17. A security product according to claim 16, wherein said first contacts include contacts electrically coupled to a microprocessor selecting said logic level.

18. A security product according to claim 16, wherein said first contacts are patterns on a circuit board, said second contacts are defined by metallic arms fixed to a common hub and said first contacts and said second contacts are coupled for relative rotation by a shaft extending through said hub to said circuit board.

19. A rotary switch having multiple positions representing binary numbers of Y places, said switch comprising:
- a printed circuit board including a plurality of first contacts disposed at a common radius in a circular pattern, said first contacts including Y contacts;
- a metallic piece defining a plurality of second electrical contacts;
- a dial capturing and biasing said metallic piece against said circuit board for rotating said second electrical contacts against said first electrical contacts to define said respective positions;
- said second electrical contacts defining unequal angles therebetween to electrically couple unique combinations of said Y contacts to an electrical logic level in said respective positions.

20. An addressable security system including a microprocessor and comprising:
- a binary coded rotary switch having X sequential positions of rotation and including;
    - a plurality of first electrical contacts fixed at a common radius, said first electrical contacts including electrically isolated contacts;
    - a plurality of second electrical contacts mounted for rotation against said first electrical contacts at said common radius, said second electrical contacts having minimal electrical resistance therebetween;
- wherein rotation of said switch sequentially through said X positions produces Y-bit binary numbers out of sequence, and said microprocessor translates said out of sequence numbers into sequence.

* * * * *